United States Patent
Dehmel et al.

(10) Patent No.: US 7,982,481 B2
(45) Date of Patent: Jul. 19, 2011

(54) MODULE FOR A PARALLEL TESTER FOR THE TESTING OF CIRCUIT BOARDS

(75) Inventors: Rüdiger Dehmel, Wunstorf (DE); Andreas Gülzow, Springe (DE); Michael Holzbrecher, Wunstorf (DE); Edward Bruchwald, Wunstorf (DE)

(73) Assignee: DTG International GmbH, Zurich (CH)

( * ) Notice: Subject to any disclaimer, the term of this patent is extended or adjusted under 35 U.S.C. 154(b) by 0 days.

(21) Appl. No.: 12/863,739

(22) PCT Filed: Jan. 19, 2009

(86) PCT No.: PCT/EP2009/050561
§ 371 (c)(1),
(2), (4) Date: Sep. 15, 2010

(87) PCT Pub. No.: WO2009/092694
PCT Pub. Date: Jul. 30, 2009

(65) Prior Publication Data
US 2010/0327895 A1    Dec. 30, 2010

(30) Foreign Application Priority Data
Jan. 25, 2008  (DE) .................. 10 2008 006 130

(51) Int. Cl.
*G01R 31/00* (2006.01)
(52) U.S. Cl. ................................. 324/756.01
(58) Field of Classification Search .......... None
See application file for complete search history.

(56) References Cited

U.S. PATENT DOCUMENTS

| | | | |
|---|---|---|---|
| 4,465,972 | A | 8/1984 | Sokolich |
| 4,674,006 | A | 6/1987 | Driller et al. |
| 4,724,377 | A | 2/1988 | Maelzer et al. |
| 4,851,765 | A | 7/1989 | Driller et al. |
| 4,939,454 | A | 7/1990 | Miner |
| 5,485,096 | A | 1/1996 | Aksu |
| 2008/0068034 | A1 | 3/2008 | Bogatin et al. |

FOREIGN PATENT DOCUMENTS

| | | |
|---|---|---|
| EP | 0 108 405 A1 | 5/1984 |
| EP | 0 406 919 A2 | 1/1991 |

OTHER PUBLICATIONS

English Translation of International Preliminary Report on Patentability, Date of Mailing Aug. 19, 2010, 9 pages.
International Search Report, dated Jul. 3, 2009, corresponding to PCT/EP2009/050561.
German Patent Office Action, corresponding to DE 10 2008 006 130.1-35, dated Sep. 25, 2008.

*Primary Examiner* — Ha Tran T Nguyen
*Assistant Examiner* — Arleen M Vazquez
(74) *Attorney, Agent, or Firm* — Christie, Parker & Hale, LLP (57) ABSTRACT

The invention relates to a module for a parallel tester for the testing of circuit boards, and to a parallel tester comprising such modules.
The modules have circuit boards standing at right-angles to the plane of the basic grid of the parallel tester, and on which contact pins are arranged along one side edge. The contact pins lie with their peripheral surfaces on flat sides of the circuit boards and protrude a short distance beyond the side edge of the circuit board. They are connected electrically and physically to contact fields formed on the circuit board.
This arrangement of the contact pins is cost-effective to produce, mechanically stable, and permits the production of modules with a high density of contact pins.

25 Claims, 8 Drawing Sheets

MODULE FOR A PARALLEL TESTER FOR THE TESTING OF CIRCUIT BOARDS

CROSS-REFERENCE TO RELATED APPLICATION

This application is a National Phase Patent Application and claims the priority of International Application Number PCT/EP2009/050561, filed on Jan. 19, 2009, which claims priority of German Patent Application Number 10 2008 006 130.1, filed on Jan. 25, 2008.

The present invention relates to a module for the testing of circuit boards, together with a parallel tester for the testing of circuit boards. In particular the present invention relates to a module for the testing of non-componented circuit boards, together with a parallel tester for the testing of non-componented circuit boards.

Devices for the testing of electrical circuit boards are known for example from U.S. Pat. No. 3,564,408 and U.S. Pat. No. 4,417,204 respectively. These devices have a contact board on which test pins are arranged in a basic grid. The test pins are connected to a test circuit via long cables. The circuit boards to be tested are laid on the test board, and an adapter may be fitted between the circuit board and the test board so as to create an electrical contact between each test point and the circuit board to be tested.

On the basis of this type of tester, modular testing devices have been developed, as described in patents DE 32 40 916 C2 and DE 33 40 180 C1. This type of tester has a baseplate on which rest vertically-arranged modules, each comprising part of the electronic test circuit and having vertically aligned test pins at their upper ends. In a tester, several such modules are mounted next to one another, with the arrangement of test pins forming a contact field which replaces the contact board. To ensure good cohesion of the modules, a perforated board may be slipped over the test pins, with each test pin passing through a hole in the perforated board and so being fixed in its position.

This modular structure of the contact field has proved to be very successful in practice. An important benefit of this modular structure is that the contact pressure applied during the testing of a circuit board is passed on to the baseplate via the modules.

Known from registered design DE 88 06 064 U1 is a further test apparatus in which the contact field is modular in form. These modules are strip-shaped in form with each, for example, having four rows of square pads or contact faces. Here it is disclosed that the pads are arranged in a grid with a grid spacing for example of 0.5-2 mm. These modules with such a close arrangement of pads have not proved successful in practice since, on the one hand due to the high number of contact points they can be read only by very large and therefore costly evaluation electronics, while on the other hand the design described in registered design DE 88 06 064 U1, with a vertically placed circuit board with the contact faces formed directly on its end face, has caused considerable problems in series production.

Known from EP 0 875 767 A2 is a test apparatus provided with evaluation electronics which have a number of test connections. This tester has a basic grid formed by a multi-layer circuit board, with contact points arranged in a grid on its upper surface. Several of these contact points are electrically interconnected by means of scanning channels running in the circuit board of the basic grid. Resting on the basic grid is an adapter and/or a translator, on which a circuit board to be tested may be placed. The adapter and/or translator creates an electrical contact between circuit board test points on the circuit board and contact points of the basic grid.

WO 02/31516 and EP 1 322 967 B1 respectively disclose a further module for a tester for the testing of circuit boards. This module has a strip-shaped section with contact points, forming one part of a basic grid of the tester. Provided below the strip-shaped section is an upright board on which is arranged part of the evaluation electronics for the analysis of test signals. The contact points on the strip-shaped section are arranged in a grid with a grid interval of no more than 2 mm, and at least two contact points of a module are electrically connected to one another in such a way that the electrically connected contact points are in contact with a single input of an electronics unit.

Described in EP 1 083 434 A2 and U.S. Pat. No. 6,445,173 B1 respectively is a further device for the testing of circuit boards, in which the basic grid is formed by circuit boards standing at right-angles to the plane of the basic grid. These circuit boards which are described as basic grid circuit boards have, on the narrow side faces lying in the plane of the basic grid, contact points which represent the contact elements of the basic grid. These contact points are connected by conductor paths which extend over one side face of the basic grid circuit boards. These basic grid circuit boards are in the form of multi-layer circuit boards in which conductor paths running at right-angles to one another are provided in different layers and form a matrix. At the intersection points of these conductor paths running at right-angles to one another, they may be connected electrically by means of via holes. With these via holes and the matrix, selected contact points of the matrix may be electrically interconnected, so that the interconnected contact points require only a single connection to the evaluation electronics. Since the conductor paths of this matrix are distributed over quite a large area of the basic grid circuit boards, their provision is significantly simpler than that of the scanning channels known from EP 0 875 767 A2, described above, To date, the maximum density of the contact points of a basic grid for a tester obtainable on the market has been 62 contact points per square centimetre, corresponding to a square grid with an edge length of 1.27 mm.

It is true that there are also testers on the market with a higher contact point density (two or four times greater). So far, however, these have been technically very complex and therefore expensive, for which reason they have been produced only in very small quantities.

In the case of testers with basic grids, the parallel testers, the intention is to increase the density of the contact points of the basic grid. This makes the production of such basic grids difficult, in particular if certain contact points of the basic grid need to be connected electrically with one another. In the basic grid circuit boards known from EP 1 083 434 A2, the production of such closely adjacent contact points on the narrow side faces of the basic grid circuit boards is difficult. In the case of the other modules with basic grids described above and with contact points electrically connected to one another, it is difficult to realise the electrical connection of selected contact points if the density of the contact points is to be further increased.

If for example one wishes to double the density of contact points (64 contact points per square centimetre), this is not possible using known technology. Thus, to produce the basic grid according to EP 0 875 767 A2 it would be necessary to provide a basic grid circuit board with 48 layers. With current methods of production, it is not possible to make such a circuit board reliably. It is impossible for all the connections in such a circuit board to be formed correctly. A defective basic grid is however not acceptable in a tester.

Another problem resulting from increasing the density of contact points is the increase in mechanical pressure on the basic grid. This pressure is proportional to the number of contact points. If the contact points are doubled, the pressure rises accordingly.

In the as yet unpublished German patent application DE 10 2006 059 429.0 and in PCT/EP2007/062888, there is described a module for a tester in which the contact points of the basic grid are arranged in a grid comprised of two interlaced square grids. In the square grids, the contact points are each spaced roughly 1.27 mm apart, with one contact point located at each corner point of a square. In the centre between four contact points of a grid located at the corners of a square, there is in each case a contact point of the other square grid. These two grids are thus offset relative to one another by half the distance between two adjacent contact points of a grid. This half distance amounts to 0.635 mm. The density of the contact points of this grid is approx. 124 contact points per square centimetre, and is therefore twice the maximum density of contact points of a basic grid of testers commonly used to date. Basic grids with such a high density of contact points are used in the testing of non-componented circuit boards, since with non-componented circuit boards it is necessary to contact a large number of circuit board test points simultaneously. This high density of contact points is obtained by providing that each of the modules comprises a support board and a contact board, with the contact board being formed by a rigid circuit board section described as the basic grid element, and at least one flexible circuit board section. Provided on the basic grid element are contact points, each of which forms part of the contact points of the basic grid.

The basic grid element is arranged on an end face of and at right-angles to the support board concerned, and the flexible circuit board section is bent back in such a way that at least part of the remaining area of the contact board is arranged roughly parallel to the support board. Each of the contact points of the basic grid element are in electrical contact with a conductor path running in the contact board and extending from the basic grid element into the flexible circuit board section. Thus, with the flexible circuit board section, the multiplicity of conductor paths connected to the contact points is deflected from the horizontal into the vertical, where plenty of space is available.

Described in the as yet unpublished DE 2007 047 269.4 is a full grid cassette with spring contact pins in a grid corresponding to the basic grid of DE 10 2006 059 429.0 as explained above. Each of the spring contact pins is wound from a wire and has no coating. The spring contact pins are located vertically in the full grid cassette by means of a film. The full grid cassette has two boards to guide the spring contact pins, which are preferably movable relative to one another in the axial direction of the spring contact pins and have freedom of movement at right-angles to the axial direction of the spring contact pins. The spring contact pins may also be designed with a central spring contact point, wherein the wire of the spring contact pins concerned is wound at the end winding of the spring contact pin with a smaller radius than the adjacent winding.

U.S. Pat. No. 4,939,454 discloses a connection system for a tester for the testing of circuit boards. This connection system has interconnection blocks, each formed in one piece from plastic and provided with holes. The interconnection blocks have the form of an elongated flat rail, with the holes extending in each case between the two end faces. A contact pin is fitted into each of the holes. A circuit board is mounted at the side of each of the interconnection blocks. The contact pins are connected electrically to the circuit board by means of wires. The contact pins are pogo pins. Several of these interconnection blocks are arranged next to one another so that, with their contact pins, they form a grid of contact elements.

The invention is based on the problem of creating a module for a tester for the testing of circuit boards, which permits a suitably high density of contact points of the basic grid, is simple and cost-effective to produce, and is reliable in operation.

The problem is solved by a module with the features of claim 1. Advantageous developments of the invention are set out in the dependent claims.

The module according to the invention for a parallel tester for the testing of circuit boards has contact points in a predetermined grid on one end face. This end face is subsequently described as the basic grid section. In the tester, several modules may be mounted parallel to one another, so that the basic grid sections of the modules form a flat-surfaced basic grid, on which an adapter and/or a translator may be placed for the contacting of a non-componented circuit board.

The module is distinguished by the fact that each module has at least one module element. A module element is formed by a circuit board and contact pins located in the area of one side edge of the circuit board, with the circuit board having two flat sides on which are provided, in the area of the side edge of the circuit board at regular intervals, contact fields connected to conductor paths and to which in each case one of the contact pins is fastened. The contact pins lie directly on the flat sides and are arranged at right-angles to the side edge so that, with their end faces, they each form one of the contact points of the basic grid section.

It has been found that, by arranging the contact pins lying on the flat sides of the circuit board and fastening them to the contact fields, a grid of contact points with the desired density of e.g. 124 contact points per square centimetre may be created in a very simple and cost-effective manner. Because of its simple structure this arrangement is very stable, and has long-term resistance to the mechanical loads which occur in test apparatus for the testing of non-componented circuit boards.

The contact pins preferably protrude at the adjacent side edge of the circuit board, so that their projecting sections can be held in a perforated grid board. The contact pins are cylindrical in shape, and their section which protrudes at the circuit board has a greater diameter than the section lying on the circuit board. The smaller the diameter of the section lying on the circuit board, the greater can be the density of contact points.

The circuit board of a module element has preferably the form of an elongated strip, with a section which is integral with the strip. This section extends over only part of the length of the strip and is provided on the side of the strip opposite the contact pins. Provided on this section, from now on referred to as the electronics section, are electronic components which are in contact with the contact pins via conductor paths formed in the circuit board. With this form of circuit board it is possible for several module elements to be mounted closely alongside one another, with the electronics sections of adjacent module elements, which because of the electronic components have the greatest thickness, being arranged offset to one another.

In the area adjacent to the contact pins, at least one strip-shaped metal support plate may be provided, with a firm physical connection to the module units. The metal support plate extends sideways from the module units to form a support. With this metal support plate, the mechanical load exerted on the basic grid may be diverted sideways on to a support frame, so that at least the electronics sections of the module elements are not under mechanical stress.

The contact pins protruding from the circuit boards of the module units may be located in holes in a perforated grid board. Preferably they project a little way out of the perforated grid board. When a full grid cassette with uncoated spring contact pins is used, as for example in DE 10 2007 047 269.4, there is the risk that these contact points or contact pins of the basic grid will not make contact if there is minimal offset between the grid of the basic grid and the grid of the full grid cassette, and if the end sections of the spring contact pins are not centred. Such faulty contacting is due on the one hand to the offset, and on the other hand to the fact that the basic grid and the guide board of the full grid cassette lying on the basic grid are generally spaced apart, so that the end section of the spring contact pins is able to deflect sideways through the annular gap between the basic grid board and the full grid cassette. If the contact pins are raised slightly from the perforated grid board, then the gap is reduced, while the spring contact pins are also contacted closer to the respective hole in the full grid cassette. As a result, their end sections are unable to deflect so far to the side.

The invention is explained in detail below with the aid of the drawings, which show by way of example in.

An embodiment of the present invention will firstly be explained with the aid of the schematic and greatly simplified representations as shown in FIGS. 1-8 of the structure of the module according to the invention.

Figure 1:
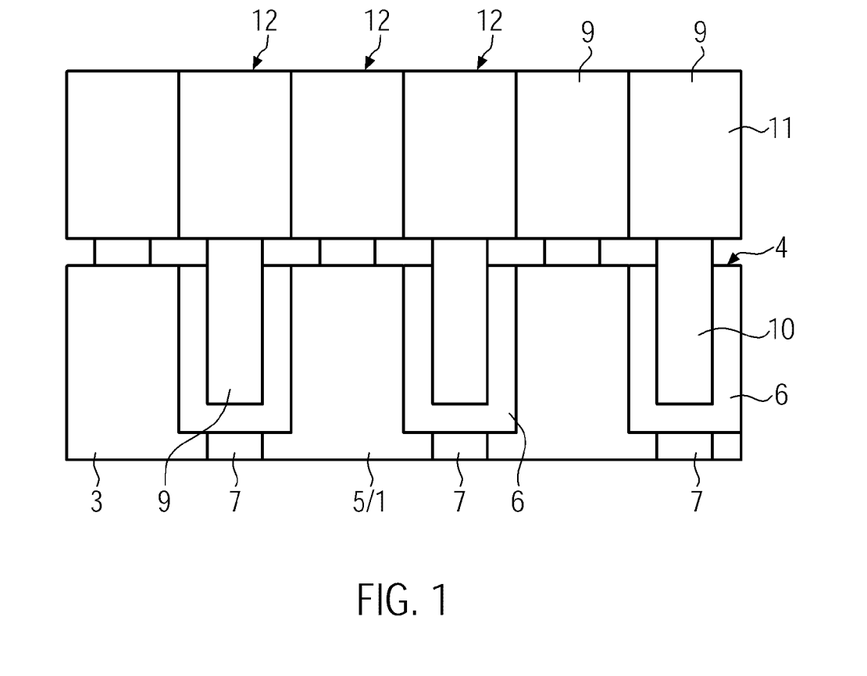
FIG. 1 a schematic and greatly simplified detail of a module element with several contact pins, in a side view FIG. 2 the detail of the module element of FIG. 1, viewed from below FIG. 3 the detail of the module element of FIG. 1, in a side view FIG. 4 a contact pin of the module element of FIG. 1, in a side view FIG. 5 a greatly simplified side view of a module element a greatly simplified side view of another module element FIG. 7 four module elements, forming part of a module according to the invention, in a greatly simplified side view FIG. 8 a greatly simplified view of a module, looking towards one end face FIG. 9a a side view of a module element FIG. 9b the module element of FIG. 9a viewed from above FIG. 9c a detail of the top view shown in FIG. 9b FIG. 9d a detail of the module element in the area of the contact pins in a side view FIG. 10a a side view of a module according to the invention FIG. 10b a partial section of the module of FIG. 10a viewed from above, and FIG. 10c an enlarged view of the partly-sectioned area of FIG. 10b.
Figure 2:
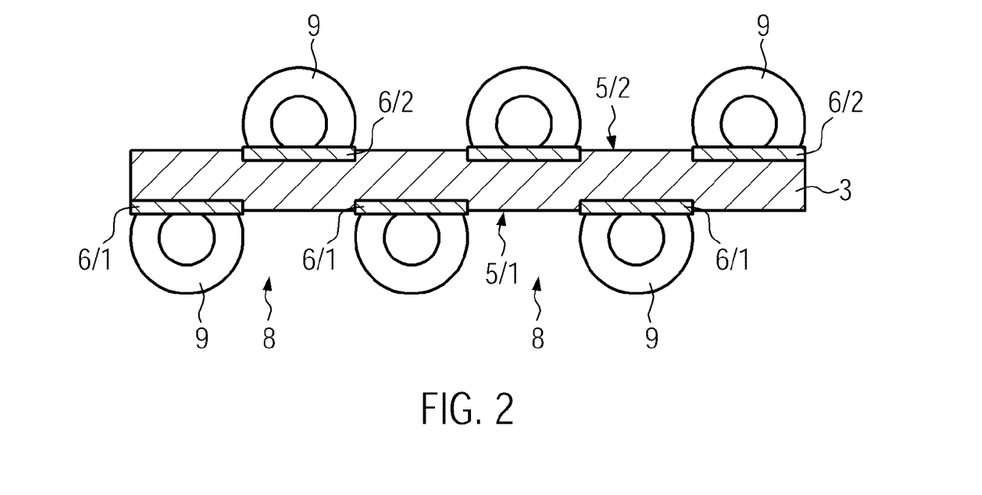
Figure 3:
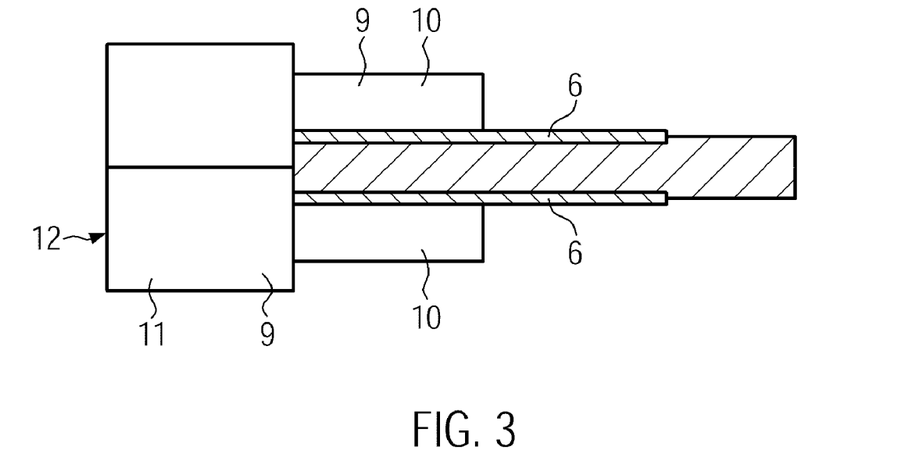

Each module 1 is formed by several module elements 2. Each module element 2 comprises a circuit board 3 with at least one straight, elongated side edge 4. The circuit board 3 is a smooth flat board with two opposite flat sides 5. In the area adjacent to or adjoining the side edge 4, contact fields 6 are formed on each of the two flat sides 5. The contact fields 6 are in the form of pad fields with an electrically conductive material such as copper or a special copper alloy exposed on the surface of the flat sides 5. The contact fields 6 are connected, electrically conductively, with conductor paths 7 running in or on the circuit boards 3.

The contact fields 6 are arranged on the respective flat sides 5 at even, regular intervals from one another. The contact fields 6 are arranged alternately on the opposite flat sides 5, i.e. the contact fields 6/1 of a first of the two flat sides 5/1 in each case border an intermediate area 8 between two adjacent contact fields 6, and on the opposite flat side 5/2 the contact fields 6/2 each lie opposite the respective intermediate areas 8 on the first flat side 5/1.

Located on each contact field is a contact pin 9. The contact pins 9 lie directly on the contact fields 6 and are aligned at right-angles to the side edge 4, with their peripheral surface lying on the contact fields 6. They are connected electrically and physically to the contact fields 6 for example by means of a soldered joint. The contact pins 9 are therefore fixed rigidly to the contact fields 6. The contact pins 9 preferably extend a little way beyond the side edges 4. Like the contact fields 6 of the opposite flat sides 5/1 and 5/2, the contact pins 9 are arranged alternately. Instead of the alternating arrangement of contact fields 6 and contact pins 9 it is also possible to arrange the contact pins 9 on opposite flat sides 5 of the circuit board 3 in pairs. In an alternative embodiment, in such an arrangement, a grid with a grid spacing of 0.635 mm is obtained. Preferably the contact pins have in the area extending beyond the side edge 4 a section 10 with a greater diameter than the that of the remaining section 11 of the contact pins 9 concerned.

In each case the contact pins 9 form a contact point with their end face 12 which protrudes at the side edge 4.

Figure 4:
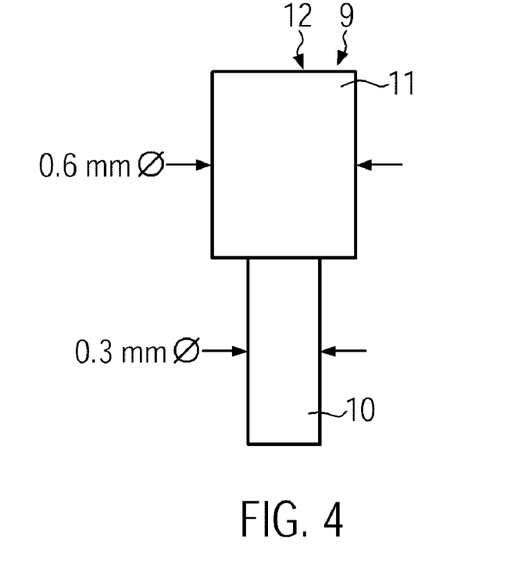

In the present embodiment, the distance between two contact pins 9 adjacent on a flat side 5 is 1.27 mm. In the thinner section 11 the diameter of the contact pins 9 is 0.3 mm. In the thicker section 10 the diameter is 0.6 mm.

Each of the circuit boards 3 has a module element 2 in the form of an elongated strip 13, with a section 14 which is integral with the strip. The section 14 extends over only part of the length of the strip 13 and is provided on the side of the strip 13 opposite the contact pins 9. Provided on this section 14, hereafter described as the electronics section 14, are electronic components 15 which are connected to the contact pins 9 via conductor paths 7 (indicated in FIGS. 5-7) in the circuit board 3.

These electronic components 15 form a switch matrix through which a multiplicity of contact points 12 may be connected alternately to just a few outputs. Such a switch matrix is described in detail in WO 99/42850 and in the corresponding U.S. Pat. No. 6,525,526 B1, to which reference is made in full.

In the area of the strip 13 of the circuit board 3, individual conductor paths are connected to one another, so that individual contact points 12 of the module elements are electrically connected to one another and guided together to the electronic components 15 of the switch matrix. This electrical connection or electrical interconnection of the contact points 12 is similar to that described in WO 02/31516, EP 875 767 A2, EP 1 083 434 A2 and EP 838 688 A respectively. Reference is therefore made to these documents in respect of the interconnection of the contact points 12.

Due to the fact that the interconnection of the contact points 12 is by means of conductor paths arranged in a circuit board 3 running at right-angles to the plane of the contact points 12, there are no limitations of space, as is the case for example with the devices according to WO 02/31516 and EP 875 767 A2 respectively. The strip 13 may be of any width desired, so that as much space as required is available for laying and interconnecting the individual conductor paths.

Figure 5:
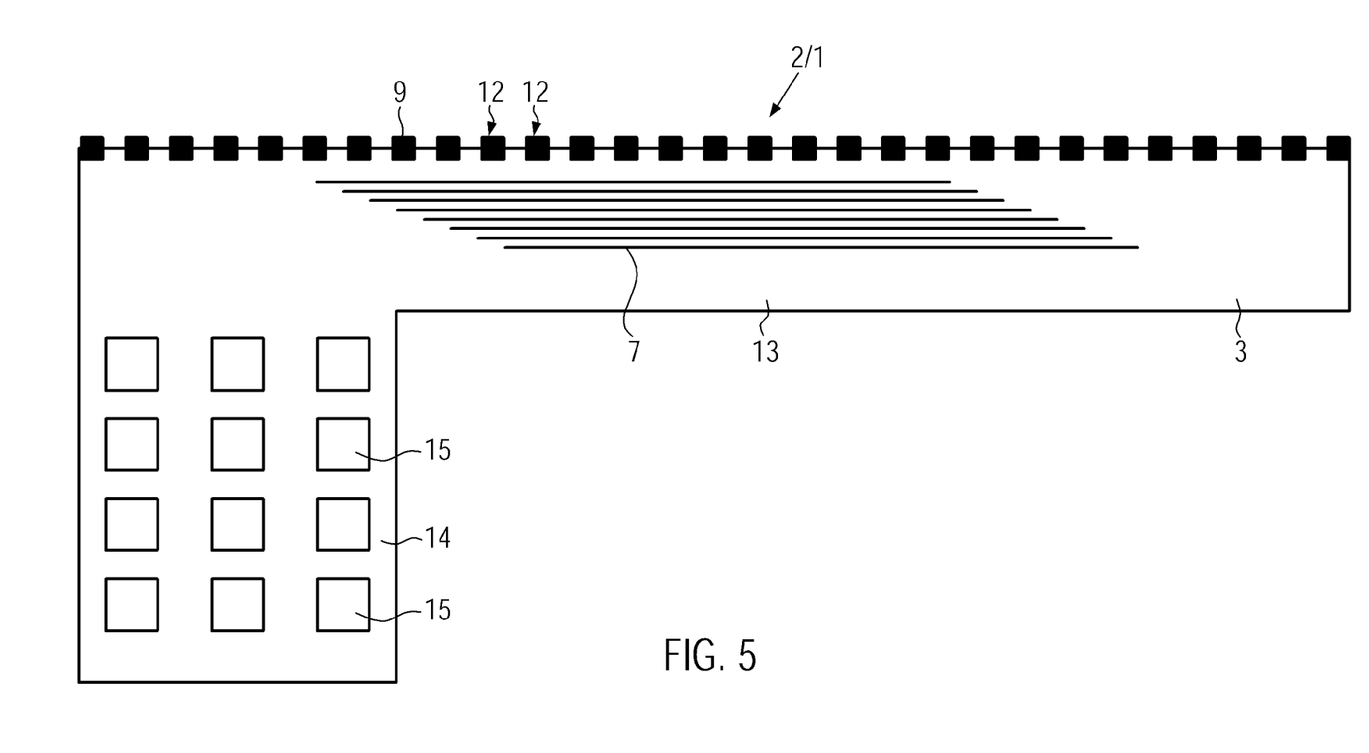
Figure 6:
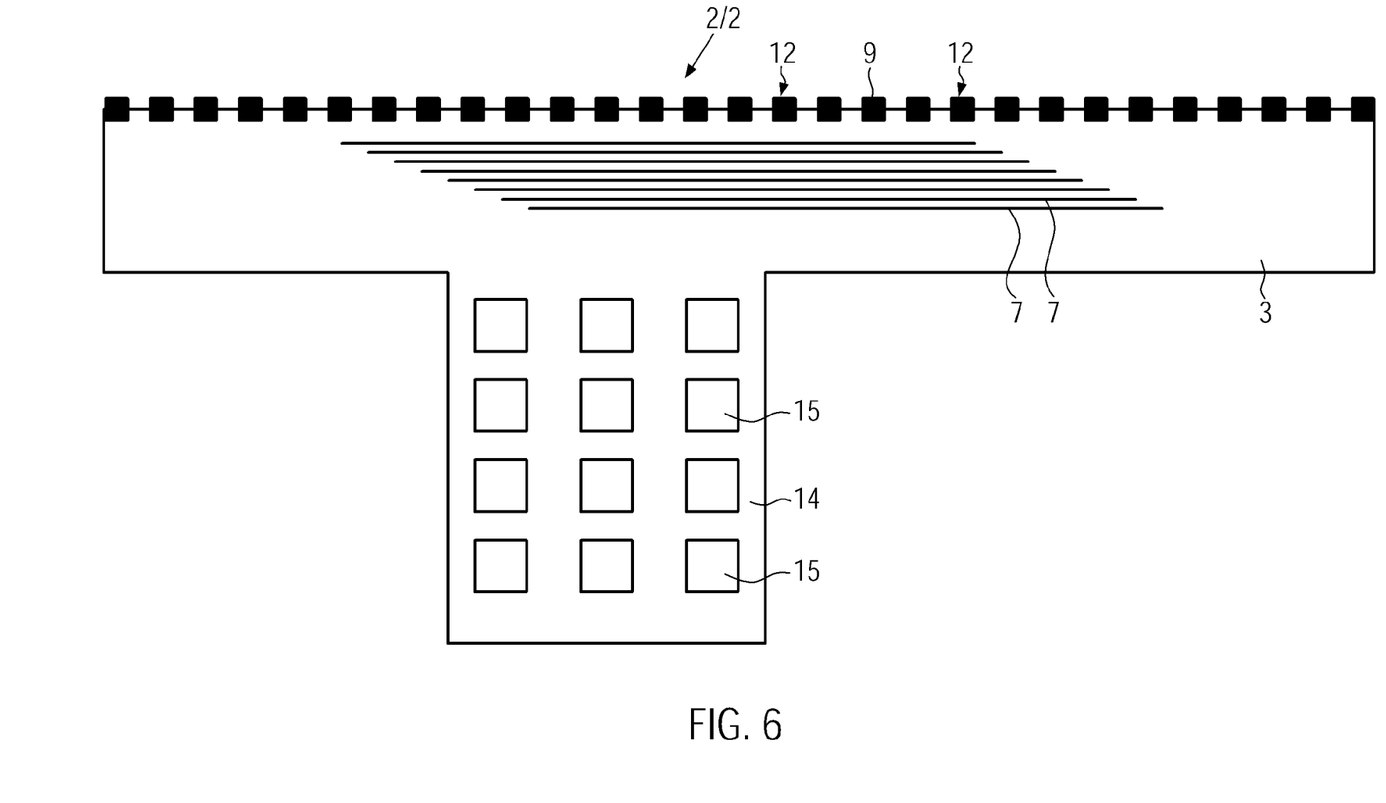

The electronics sections 14 are preferably located at different points on the strip 13 of the circuit board 3. FIG. 5 shows an example in which the electronics section 14 is located at the end of a strip, while on the other hand FIG. 6 shows an example in which the electronics section is placed a short distance from the end of the strip, with this distance from the end corresponding roughly to the width of such an electronics section 14.

Figure 7:
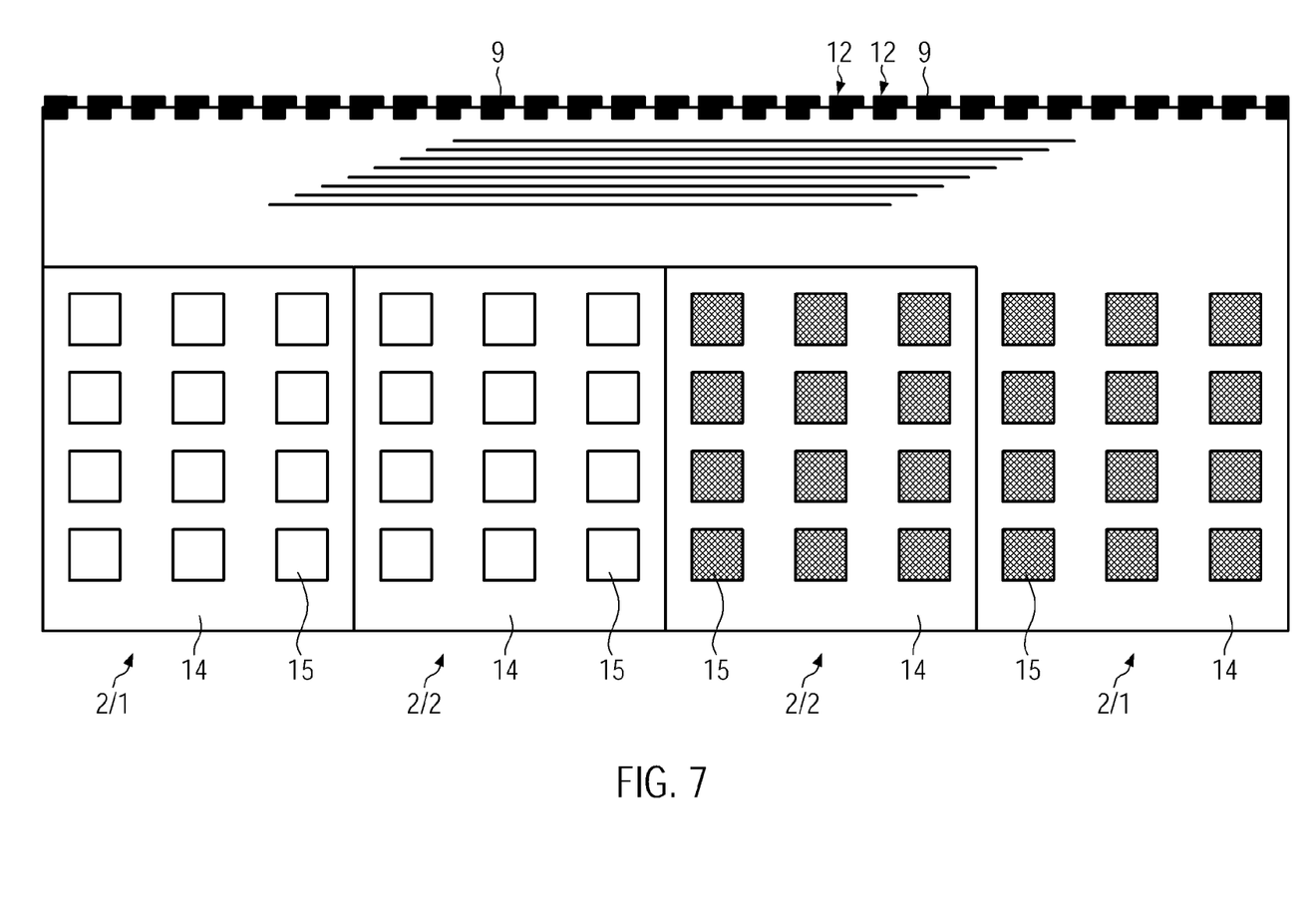

FIG. 7 shows how these two types of module element 2/1 and 2/2 may be mounted alongside one another, with scope for mounting four module elements next to one another in such a way that the individual electronics sections 14 are offset with space between them. Here two module elements 2/1 are used, each with electronics sections 14 fitted at the end. In the arrangement according to FIG. 7, the electronics sections 14 shown on the left have components 15 in the top part of the image plane of FIG. 7 (shown in white), and the electronics sections 14 shown on the right have components 15 below the image plane (shown in black). The module elements 2/1 with end-mounted electronics sections 14 are thus identical in design. They are only reversed relative to one another, so that the electronics section of one module element 2 is at the left-hand end, and the electronics section of the other module element is at the right-hand end. In a similar manner, however, the module elements 2/2 with their electronics sections offset towards the centre are identical in design, and are only reversed relative to one another.

Figure 8:
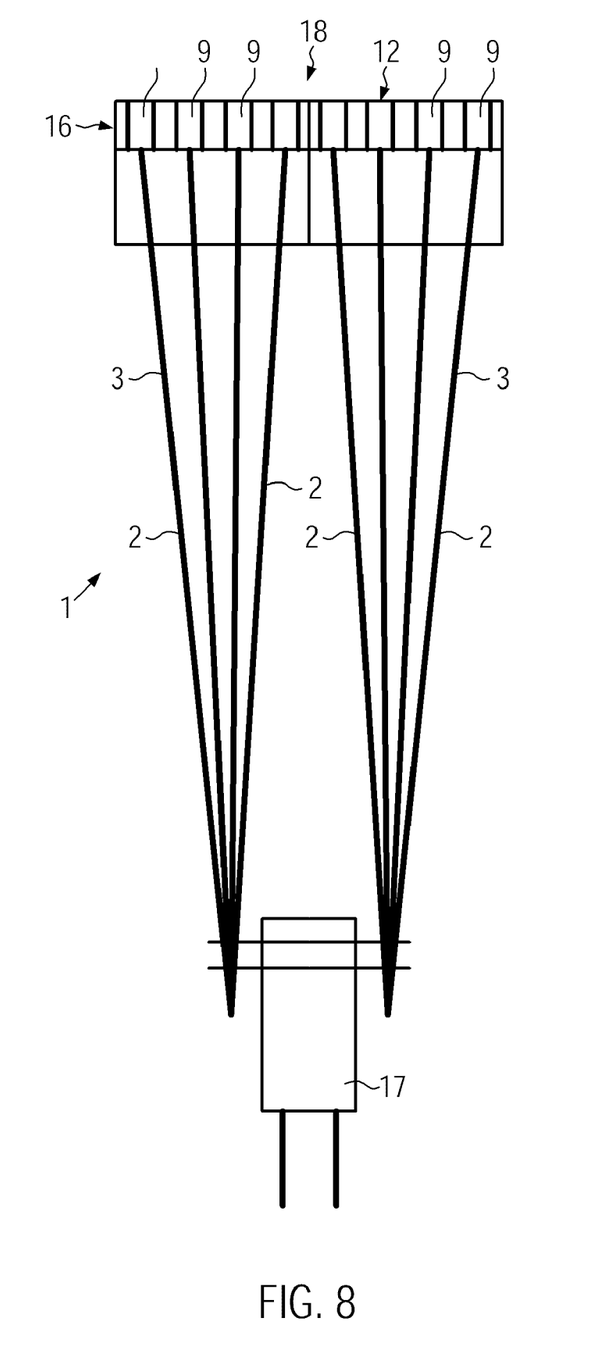
Figures 9A, 9B, 9C, 9D:
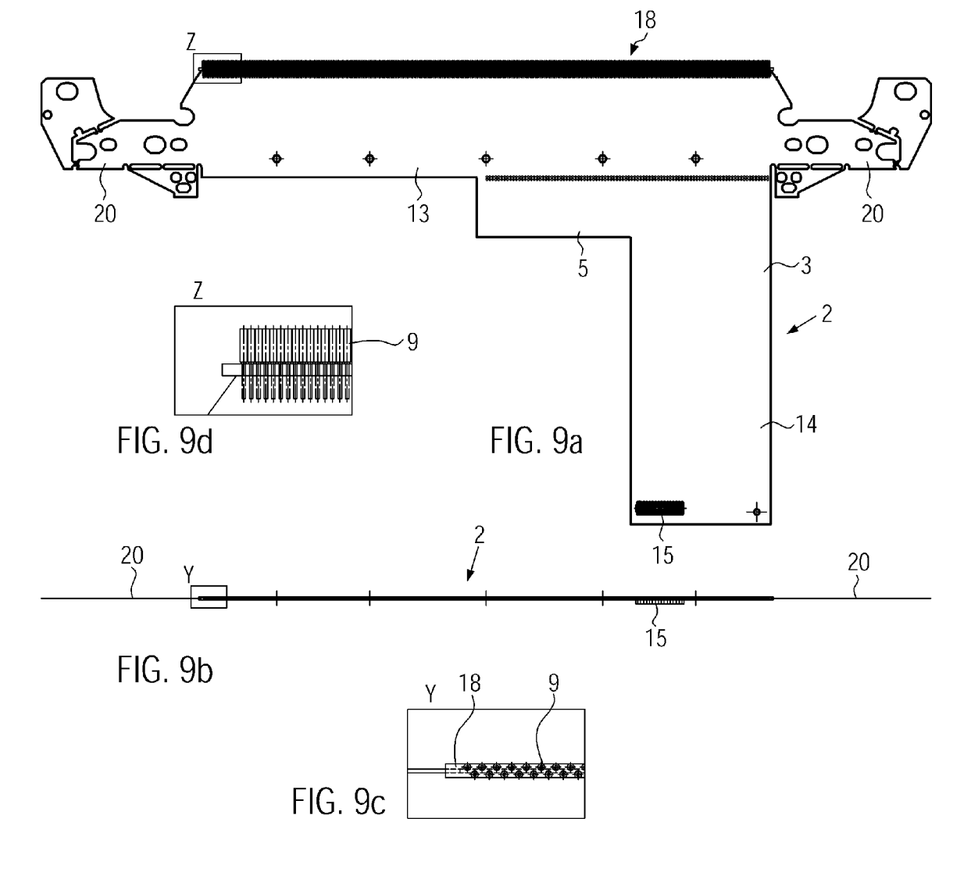

Two sets each with four module units 2 form a module 1 (FIG. 8). The circuit boards 3 may be bonded together in the areas adjacent to the contact pins 9. Each of the contact pins 9 is located, by its section 10 which projects over the side edge 4, in a hole in a strip-shaped perforated grid board 16. If the circuit boards are not bonded together, then they are fixed in three dimensions through the engagement of the contact pins 9 in the holes of the perforated grid board 16.

Preferably the free ends of the contact pins 9 extend a short distance (e.g. 0.1 mm) beyond the perforated grid board 16. The electronics sections 14 are connected physically and electrically by their edges furthest from the contact pins 9 to a multipole connector 17 which conducts the conductor paths from the switch matrix on the electronics sections 14 to an evaluation electronics unit. The strip-shaped perforated grid board 16 has a width of 10.16 mm. The contact pins 9 are located in the strip-shaped perforated grid board 16 by frictional locking. It may also be expedient here to provide snap-in means, so that the contact pins 9 engage in the holes of the perforated grid board 16.

This module 1 thus forms at its end face 18 an arrangement of contact points 12 in a grid which is comprised of two square grids interlaced with one another. In the square grids, the contact points are each spaced around 1.27 mm from one another, with one contact point located in each corner point of a square. In the centre between four contact points of a grid located at the corners of a square, there is in each case a contact point of the other square grid. These two grids are thus offset relative to one another by half the distance between two adjacent contact points of a grid. This half distance amounts to 0.635 mm. The density of the contact points of this grid is approx. 124 contact points per $cm^2$. This end face 18 of the module 1 is hereafter described as the basic grid section 18.

In a parallel tester for the testing of circuit boards, several of these modules are mounted alongside one another, with their basic grid sections 18 adjacent to one another in one plane, thus forming a flat-surfaced basic grid. In testers for the testing of circuit boards on two sides, in each case two sets of modules are arranged opposite one another, with the basic grid sections and basic grids respectively designed to face one another, so that a circuit board to be tested may be held and contacted between two basic grids by means of suitable adapters.

In the above embodiment, a strip-shaped perforated grid board 16 is provided for each set of four module elements 2.

Within the scope of the invention it is of course also possible to use a perforated grid board extending over the whole surface of the basic grid of the parallel tester, in which the modules with their projecting contact pins are then inserted in the perforated grid board. In this embodiment, the perforated grid board is not therefore part of the module.

Within the scope of the invention it is of course also possible to provide different grid spacing and other grid arrangements.

An important benefit of the modules according to the invention is their simple and stable structure. On the one hand the contact pins may be fixed electrically and physically, easily and cost-effectively, to the contact fields 6 with their relatively large surfaces. On the other hand the arrangement of the circuit boards 3 at right-angles to the basic grid provides a large surface for the routing of the conductor paths, making possible the creation of complex circuitry and electrical interconnections essentially as desired. In addition it is of advantage that the circuit boards of each module element may be multi-layer in design, preferably with four layers. By this means it is possible to create relatively complex circuit structures within the circuit board itself. The provision of several circuit boards within a module increases the options for circuit routing. If one were to replace four module elements by a single circuit board, this would need 16 layers to provide the same scope for line routing, which on the one hand is very costly and on the other hand very much more prone to failure.

A further benefit lies in the fact that the contact pins of the present embodiment are a mass-produced article, since such contact pins are conventionally used for plug connectors. They are therefore available on very advantageous terms with a high degree of quality and precision.

In comparison with conventional modules offering a high density of contact points, this module may be produced significantly more advantageously, and is also reliable due to the simple physical and electrical attachment of the contact pins.

Preferably fastened to each side of the circuit board 3 of a module element 2 is a metal support plate 19 which, at both edges of the circuit board 3 extends a good distance beyond the area of the basic grid section and forms projecting tabs 20 at the side, which serve as supports. The metal support plates 19 are strip-shaped in form, while their width may be less than the width of the strip 13 of the circuit boards 3. In the parallel tester, the tabs 20 lie on a support frame, so that the mechanical load exerted on the basic grid sections is diverted via the tabs to the support frame. The area of the circuit boards 3, which is located beneath the metal support plates 19, is thus free from mechanical loading.

The metal support plates preferably have a thickness of 0.4 mm and are bonded flat to the respective circuit boards 3. By this means the correct distance between adjacent module elements, to produce the grid of contact points 12 for the basic grid, is obtained. In applying the adhesive layer care should be taken to ensure that the area of the contact pins 9 remains free from adhesive.

FIGS. 9*a* to 9*d* show a module element 2 as made for a prototype. In the module element as shown in FIGS. 9*a* to 9*d*, no metal support plate 19 has yet been applied to the circuit board.

Figure 10A:
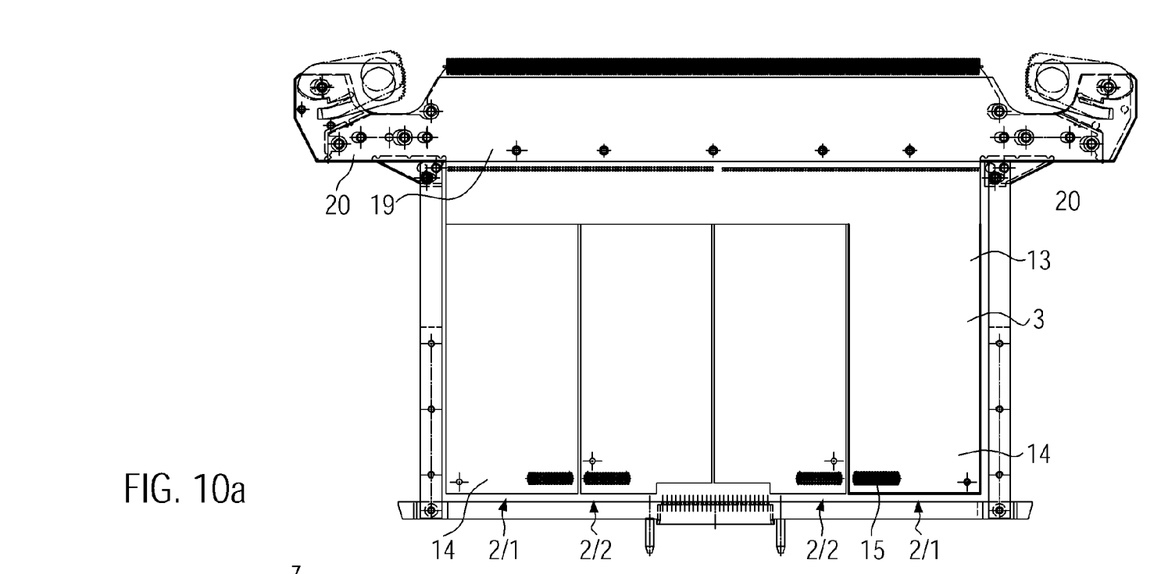
Figure 10B:
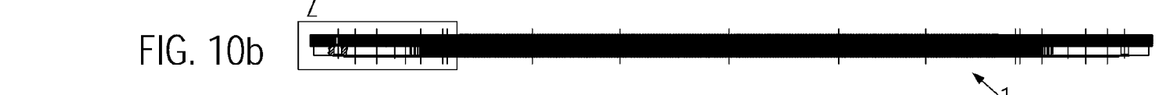
Figure 10C:
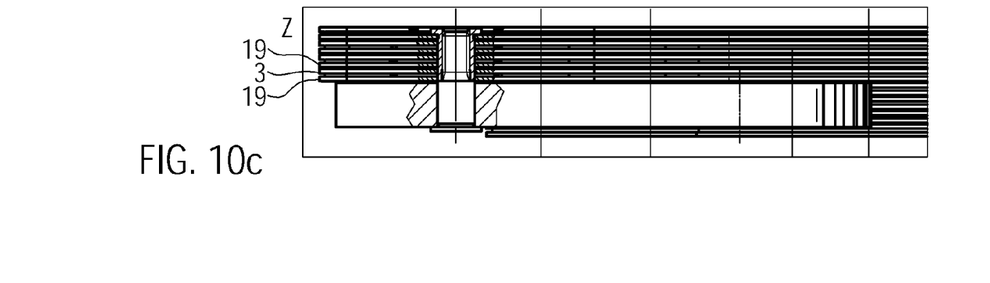

FIGS. 10*a* to 10*c* show a module 1 formed of eight module elements 2. Here the metal support plates 19 are bonded and screwed flat to the circuit boards 3 in the area below the contact pins 9. In the area of the tabs 20, both the circuit boards 3 and the metal support plates 19 extend to form a rigid composite structure.

LIST OF REFERENCE NUMBERS 1 module
2 module element
3 circuit board
4 side edge
5 flat side
6 contact field
7 conductor path
8 intermediate area
9 contact pin
10 section
11 section
12 end face of contact pin 9 or contact point
13 strip
14 electronics section
15 component
16 perforated grid board
17 multipole connector
18 end face
19 metal support plate
20 tab

The invention claimed is:

1. A module for a parallel tester for testing circuit boards:
wherein the module has an end face on which contact points are arranged in a predetermined grid forming a basic grid section;
wherein in the parallel tester several modules are arranged in parallel alongside one another, so that the basic grid section of the modules form a flat-surfaced basic grid on which an adapter or translator may be arranged for contacting a non-componented circuit board; and
wherein each module has at least one module element, with a module element being formed of a circuit board and contact pins arranged in an area of a side edge of the circuit board, wherein the circuit board has two flat sides on which are provided, in the area of the side edge of the circuit board at regular intervals, contact fields connected to conductor paths and to which in each case one of the contact pins is attached, wherein the contact pins are arranged lying on the flat sides and at right-angles to the side edge and extend at least up to the side edge, so that they form with their end faces in each case one of the contact points of the basic grid section.

2. The module according to claim 1, wherein the contact pins protrude at an adjacent side edge of the circuit board.

3. The module according to claim 2, wherein the contact pins are cylindrical in shape and, at a first section protruding from the circuit board, have a greater diameter than at a second section lying on the circuit board.

4. The module according to claim 3, wherein the contact pins of the opposite flat sides of the circuit board of a module element are arranged alternately.

5. The module according to claim 1, wherein the contact pins of the opposite flat sides of the circuit board of a module element are arranged alternately.

6. The module according to claim 5, wherein each module comprises several module elements.

7. The module according to claim 6, wherein the circuit board of a module element has a form of an elongated strip with a section which is integral with the strip, wherein the section extends over only part of a length of the strip and is mounted on a side of the strip opposite the contact pins, and provided on this section, hereafter described as the electronics section, are electronic components which are in contact with the contact pins via conductor paths formed in the circuit board.

8. The module according to claim 7, wherein the module elements of a module are designed with electronics sections offset from one another.

9. The module according to claim 8, wherein the circuit board of the module element is designed as a multi-layer circuit board, in particular a four-layer circuit board.

10. The module according to claim 9, wherein in an area adjacent to the contact pins at least one strip-shaped metal support plate is provided and firmly connected physically to the module element or elements, wherein the metal support plate protrudes from the side of the module elements and forms a support.

11. The module according to claim 1, wherein each circuit board of a module element is provided with a metal support plate, wherein the respective circuit board and the metal support plate are preferably bonded together.

12. The module according to claim 11, wherein the module has on its end face a strip-shaped perforated grid board with holes arranged in a predetermined grid, wherein one of the contact pins is positively supported in each hole, and that the contact pins extend through the perforated grid board and with their free ends protruding a short distance beyond the perforated grid board.

13. The module according to claim 12, wherein certain contact pins are electrically connected to one another by means of conductor paths running in the circuit board of the module elements.

14. The module according to claim 1, wherein each module comprises several module elements.

15. The module according to claim 1, wherein the circuit board of a module element has a form of an elongated strip with a section which is integral with the strip, wherein the section extends over only part of a length of the strip and is mounted on a side of the strip opposite the contact pins, and provided on this section, hereafter described as the electronics section, are electronic components which are in contact with the contact pins via conductor paths formed in the circuit board.

16. The module according to claim 15, wherein the module elements of a module are designed with electronics sections offset from one another.

17. The module according to claim 1, wherein the circuit board of the module element is designed as a multi-layer circuit board, in particular a four-layer circuit board.

18. The module according to claim 1, wherein in an area adjacent to the contact pins at least one strip-shaped metal support plate is provided and firmly connected physically to the module element or elements, wherein the metal support plate protrudes from the side of the module elements and forms a support.

19. The module according to claim 18, wherein each circuit board of a module element is provided with a metal support plate, wherein the respective circuit board and the metal support plate are preferably bonded together.

20. The module according to claim 1, wherein the module has on its end face a strip-shaped perforated grid board with holes arranged in a predetermined grid, wherein one of the contact pins is positively supported in each hole, and that the contact pins extend through the perforated grid board and with their free ends protruding a short distance beyond the perforated grid board.

21. The module according to claim 1, wherein certain contact pins are electrically connected to one another by means of conductor paths running in the circuit board of the module elements.

22. The module according to claim 21, wherein the module comprises eight module elements, wherein the module elements have a first and a second type of circuit board, wherein the first type of circuit board has an electronics section at a side edge, and the second type of circuit board has an electronics section located with clearance from a side edge, and in each case four module elements are mounted alongside one another in such a way that all electronics sections of the four module elements are offset from one another.

23. The module according to claim 1, wherein the module comprises eight module elements, wherein the module elements have a first and a second type of circuit board, wherein the first type of circuit board has an electronics section at a side edge, and the second type of circuit board has an electronics section located with clearance from a side edge, and in each case four module elements are mounted alongside one another in such a way that all electronics sections of the four module elements are offset from one another.

24. A parallel tester for the testing of circuit boards:
wherein the parallel tester has a basic grid formed of several modules, wherein each module has an end face on which contact points are arranged in a predetermined grid, and the end face defines a basic grid section, wherein in the tester several modules are arranged in parallel alongside one another, so that the basic grid section of the modules form a flat-surfaced basic grid on which an adapter or translator may be arranged for contacting a non-componented circuit board; and wherein each module has at least one module element, with a module element being formed of a circuit board and contact pins arranged in an area of a side edge of the circuit board, wherein the circuit board has two flat sides on which are provided, in the area of the side edge of the circuit board at regular intervals, contact fields connected to conductor paths and to which in each case one of the contact pins is attached, wherein the contact pins are arranged lying on the flat sides and at right-angles to the side edge and extend at least up to this side edge, so that they form with their end faces in each case one of the contact points of the basic grid section.

25. The parallel tester according to claim 24, wherein the contact pins rest in a perforated grid board which extends over the basic grid.

\* \* \* \* \*